(12) United States Patent
Otremba et al.

(10) Patent No.: US 9,978,671 B2
(45) Date of Patent: May 22, 2018

(54) POWER SEMICONDUCTOR DEVICE

(71) Applicant: Infineon Technologies Austria AG, Villach (AT)

(72) Inventors: Ralf Otremba, Kaufbeuren (DE); Fabio Brucchi, Villach (AT); Teck Sim Lee, Melaka (MY); Xaver Schloegel, Sachsenkam (DE); Franz Stueckler, St.Stefan (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days. days.

(21) Appl. No.: 14/661,054

(22) Filed: Mar. 18, 2015

(65) Prior Publication Data

US 2015/0270208 A1  Sep. 24, 2015

(30) Foreign Application Priority Data

Mar. 24, 2014 (DE) ........................ 10 2014 104 013

(51) Int. Cl.
*H01L 21/50* (2006.01)
*H01L 23/522* (2006.01)
(Continued)

(52) U.S. Cl.
CPC ...... *H01L 23/49575* (2013.01); *H01L 21/565* (2013.01); *H01L 23/49503* (2013.01); *H01L 23/49562* (2013.01); *H01L 23/49589* (2013.01); *H01L 24/85* (2013.01); *H01L 25/072* (2013.01); *H01L 25/50* (2013.01); *H01L 23/3107* (2013.01); *H01L 24/48* (2013.01); *H01L 24/49* (2013.01); *H01L 2224/0603* (2013.01); *H01L 2224/48091* (2013.01); *H01L 2224/48101* (2013.01); *H01L 2224/48106* (2013.01); *H01L 2224/48108* (2013.01); *H01L 2224/48137* (2013.01); *H01L 2224/48247* (2013.01); *H01L 2224/48472* (2013.01);
(Continued)

(58) Field of Classification Search
CPC .............................. H01L 21/50; H01L 23/522
See application file for complete search history.

(56) References Cited

U.S. PATENT DOCUMENTS 4,989,117 A * 1/1991 Hernandez ................. 361/306.2
5,804,631 A * 9/1998 Mine et al. .................. 524/440
(Continued)

FOREIGN PATENT DOCUMENTS

CN          103367321 A      10/2013
DE   10 2006 008 632 A1      8/2007
(Continued)

*Primary Examiner* — Marc Armand
(74) *Attorney, Agent, or Firm* — Viering, Jentschura & Partner mbB

(57) ABSTRACT

A power semiconductor device is provided. The power semiconductor device includes a leadframe, which includes a first chip carrier part and at least one second chip carrier part, which are fitted at a distance from one another and are in each case electrically conductive, at least one first power semiconductor component applied on the first chip carrier part, at least one second power semiconductor component applied on the second chip carrier part, external contacts in the form of external leads, and a capacitor. The capacitor is mounted on two adjacent external leads.

20 Claims, 5 Drawing Sheets

(51) Int. Cl.
*H01L 23/495* (2006.01)
*H01L 21/56* (2006.01)
*H01L 25/07* (2006.01)
*H01L 25/00* (2006.01)
*H01L 23/31* (2006.01)
*H01L 23/00* (2006.01)

(52) U.S. Cl.
CPC ............... *H01L 2224/49171* (2013.01); *H01L 2224/73265* (2013.01); *H01L 2224/85801* (2013.01); *H01L 2924/00014* (2013.01); *H01L 2924/13055* (2013.01); *H01L 2924/13091* (2013.01); *H01L 2924/181* (2013.01); *H01L 2924/19101* (2013.01); *H01L 2924/19105* (2013.01)

(56) References Cited

U.S. PATENT DOCUMENTS

| | | | |
|---|---|---|---|
| 5,917,233 A * | 6/1999 | Fryklund | H01L 23/66 257/665 |
| 7,679,197 B2 | 3/2010 | Otremba | |
| 8,247,937 B2 | 8/2012 | Minato et al. | |
| 2005/0093121 A1* | 5/2005 | Chen | H01L 23/4334 257/678 |
| 2007/0200219 A1 | 8/2007 | Otremba | |
| 2008/0150094 A1* | 6/2008 | Anderson | H01L 23/49541 257/659 |
| 2010/0327709 A1 | 12/2010 | Minato et al. | |
| 2011/0291236 A1 | 12/2011 | Hayashi et al. | |
| 2013/0214427 A1 | 8/2013 | Nakanoya | |
| 2013/0256912 A1* | 10/2013 | Prueckl | H01L 24/24 257/777 |
| 2014/0001619 A1 | 1/2014 | Yoo et al. | |
| 2014/0254991 A1* | 9/2014 | Strzalkowski | 385/89 |

FOREIGN PATENT DOCUMENTS

DE  10 2010 017 518 A1  8/2011
DE  102011002026 A1  2/2014

* cited by examiner

POWER SEMICONDUCTOR DEVICE

CROSS-REFERENCE TO RELATED APPLICATION

This application claims priority to German Patent Application Serial No. 10 2014 104 013.9, which was filed Mar. 24, 2014, and is incorporated herein by reference in its entirety.

TECHNICAL FIELD

Various embodiments relate generally to a power semiconductor device. In this case, a power semiconductor device is understood to mean an arrangement having electronic components such as is increasingly being used for the space- and cost-saving construction of highly integrated electronic components. In such an arrangement, a plurality of semiconductor chips are accommodated in a housing and different electronic components, together with passive components, are arranged on a carrier. The electronic components are fixedly connected to the carrier and are electrically interconnected in accordance with the envisaged application.

BACKGROUND

Capacitors having capacitances in the range of one nF to 10 µF are required for analog integrated circuits and for decoupling digital integrated circuits from interference on supply lines. In known multi-chip module concepts, said capacitors are arranged as discrete capacitor components on the carrier. In this case, the capacitor components are usually used in an SMD (surface-mounted device) design. This solution involves high expenditure in terms of costs and space and, moreover, has the consequence that the capacitors cannot be mounted arbitrarily near to the integrated circuits.

The document DE 10 2006 008 632 A1 discloses a power semiconductor device having a leadframe, at least one vertical power semiconductor component and at least one further electronic component, in particular a capacitor, wherein the electronic component is arranged on the power semiconductor component.

SUMMARY

A power semiconductor device is provided. The power semiconductor device includes a leadframe, which includes a first chip carrier part and at least one second chip carrier part, which are fitted at a distance from one another and are in each case electrically conductive, at least one first power semiconductor component applied on the first chip carrier part, at least one second power semiconductor component applied on the second chip carrier part, external contacts in the form of external leads, and a capacitor. The capacitor is mounted on two adjacent external leads.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
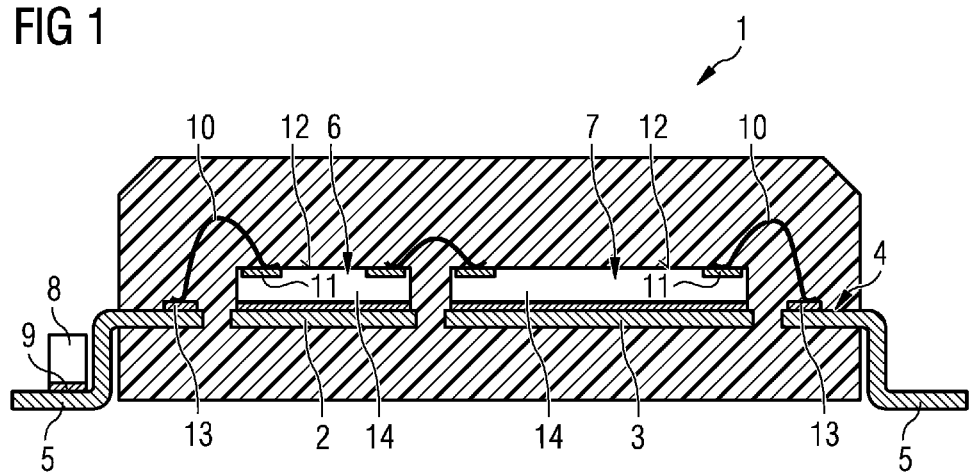
FIG. 1 shows a schematic view of a power semiconductor device in accordance with embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a power semiconductor device which includes a capacitor and can be realized in a space-saving manner.

In various embodiments, a power semiconductor device is provided including a leadframe, which includes a first chip carrier part and at least one second chip carrier part, which are fitted at a distance from one another and are in each case electrically conductive, and external contacts in the form of external leads, at least one first power semiconductor component applied to the first chip carrier part, at least one second power semiconductor component applied to the second chip carrier part, and a capacitor. In this case, the capacitor is mounted on two adjacent external leads.

Such a power semiconductor device may have the effect that it can be realized in a space-saving manner since the capacitor is mounted very near to the integrated circuits compared with customary power semiconductor devices. Two adjacent external leads are understood in this case to mean two directly adjacent, that is to say directly successive, external leads. The fact that the capacitor is mounted very near to the integrated circuits furthermore may have the effect that the efficacy and hence the efficiency of the capacitor may also be increased. Furthermore, by virtue of the fact that capacitor and integrated circuits are mounted very near to one another, it is possible to reduce the areal extent of a cooling body or a heat sink that is mounted on one side of the leadframe and serves for dissipating heat loss from the power semiconductor device. In this regard, power transistors are predominantly produced in housings that enable mounting on cooling bodies, since otherwise it is not possible to dissipate power loss amounting to as much as a few kilowatts in the case of some types and applications.

In this case, the two adjacent external leads may include soldering connections for connecting the capacitor, and the capacitor can thus be mounted in an SMD design. While the connection wires of conventional components have to be led through populating holes and soldered on the rear side of a printed circuit board, the need for this is obviated in the case of SMD designs. As a result, it is possible to realize very dense populations and primarily a double-sided population of the printed circuit board, which has a positive influence on the electrical properties of the circuits especially at relatively high frequencies and reduces the space requirement of the components. This in turn ensures that smaller and at the same time significantly more cost-effective modules can be realized.

The power semiconductor device furthermore may include bonding wires for electrically connecting contact areas on active top sides of the first power semiconductor component and of the second power semiconductor component and contact areas on the external leads. In this regard, components having a high mechanical loading, for example power semiconductor components, usually still have to be fixed on the printed circuit board by through-hole mounting, especially since for purely surface-mounted components under high mechanical loading or high current loading there is the risk that soldered joints or the conductor tracks would be subjected to excessively high stress or even damaged.

In this case, the soldering connections can differ from the contact areas on the external leads, as a result of which the mounting of the capacitor and of the bonding wires can be further simplified.

Here the external leads in each case may include a first part, on which the contact areas are arranged and which lies in the same horizontal plane as the first chip carrier part and the second chip carrier part, a signal lead, which is oriented parallel to the first part, and an angled portion arranged between the first part and the signal lead, orthogonally with respect to the first part and the signal lead. As a result, it can furthermore be ensured that compared with customary external leads having a 40° angled portion, the capacitor can be mounted significantly nearer to the integrated circuits, as a result of which the requisite space requirement can be further optimized in the realization of the power semiconductor device.

In accordance with one embodiment, here the power semiconductor device furthermore includes a housing composed of a plastic compound, which housing encloses at least the chip carrier parts, the first and second power semiconductor components and the capacitor. In this case, the plastic compound not only serves for mechanically protecting the first and second power semiconductor components, but also forms an electrical insulation in the interspaces between first and second chip carrier parts, which are usually at different potentials of the supply voltage. Since the capacitor is now likewise embedded into the plastic compound, it can likewise be mechanically protected.

Figure 6:
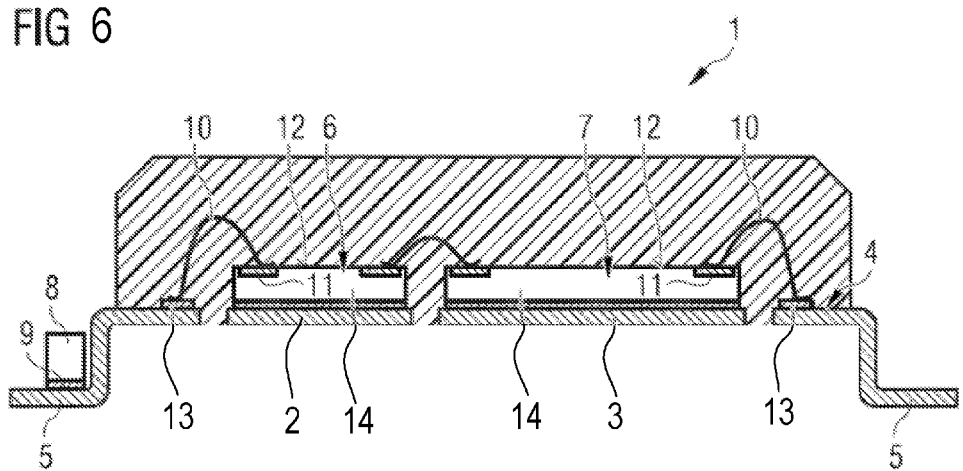
FIG. 6 shows a schematic view of a power semiconductor device in accordance with embodiments.

In this case, the plastic compound can embed at least one upper surface of the first chip carrier part and of the second chip carrier part and can leave free at least one lower surface of the first chip carrier part and of the second chip carrier part, in such a way that the plastic compound has a lower outer surface which, together with the lower surfaces of the first chip carrier part and of the second chip carrier part, forms a common outer surface of the power semiconductor device, as may be shown in FIG. 6. The lower surfaces of the first chip carrier part and of the second chip carrier part can thus provide a ground contact area of the power semiconductor device. Moreover, the use of a device housing with a fully encapsulated chip carrier can be avoided, as a result of which the heat dissipation path of the power semiconductor device can be reduced, the thermal resistance can be reduced and the reliability of the power semiconductor device can thus be improved.

The power semiconductor device may also include at least one bridge circuit having a high-side switch and a low-side switch, wherein the lower-side switch is integrated in the first power semiconductor component and the high-side switch is integrated in the second power semiconductor component. In this regard, it is known, for example, to control a DC motor by a so-called bridge circuit that enables operation of the DC motor in both directions of rotation. In this case, the high-side switch and the low-side switch lie on different chip carrier parts and are supplied with the potentials of the supply voltage directly via the chip carrier parts lying under them.

Furthermore, the power semiconductor device may also include a cascade circuit. In this regard, in the case of semiconductor high-voltage switches it is known to implement a cascade circuit (series circuit) of power semiconductor components in order that a desired dielectric strength is ensured.

The power semiconductor components can be MOSFETs or IGBTs. Generally, the term power semiconductors denotes transistors for switching or controlling large voltages, currents or powers.

In various embodiments, the power semiconductor device is accommodated in a TO housing. TO (transistor outline) housing is understood to mean housings having usually two or three external contacts in the form of external leads for low-power and power semiconductors. These standard housings are particularly cost-effective to manufacture. Moreover, such a power semiconductor device can be integrated in existing applications easily and without a high outlay, especially since the dimensions of the housing do not differ from those of conventional power semiconductor components.

A further embodiment also specifies a method for producing a power semiconductor device. In this case, the method includes the following: in this regard, a first electrically conductive chip carrier part, a second electrically conductive chip carrier part and external contacts in the form of external leads are provided. Furthermore, at least one first power semiconductor component is applied to the first chip carrier part and at least one second power semiconductor component is applied to the second chip carrier part. Afterward, contact areas on active top sides of the first and second power semiconductor components are electrically connected to contact areas on the external leads. Furthermore, a capacitor is mounted onto two adjacent external leads.

Such a method may have the effect that it can be used to produce a space-saving power semiconductor device, since the capacitor is mounted very near to the integrated circuits compared with customary power semiconductor devices. Two adjacent external leads are understood in this case to mean two directly adjacent, that is to say directly successive, external leads. The fact that the capacitor is mounted very near to the integrated circuits furthermore may have the effect that the efficacy and hence the efficiency of the capacitor can also be increased. Furthermore, by virtue of the fact that capacitor and integrated circuits are mounted very near to one another, it is possible to reduce the areal extent of a cooling body or a heat sink that is mounted on one side of the leadframe and serves for dissipating heat loss from the power semiconductor device. In this regard, power transistors are predominantly produced in housings that enable mounting on cooling bodies, since otherwise it is not possible to dissipate power loss amounting to as much as a few kilowatts in the case of some types and applications.

In this case, the capacitor can be soldered onto the two adjacent external leads and thus be mounted in an SMD design. While the connection wires of conventional components have to be led through populating holes and soldered on the rear side of a printed circuit board, the need for this is obviated in the case of SMD designs. As a result, it is possible to realize very dense populations and primarily a double-sided population of the printed circuit board, which has a positive influence on the electrical properties of the circuits especially at relatively high frequencies and reduces the space requirement of the components. This in turn ensures that smaller and at the same time significantly more cost-effective modules can be realized.

Moreover, contact areas on the active top sides of the first and second power semiconductor components can be electrically connected to contact areas on the external leads in each case via bonding wires. In this regard, components having a high mechanical loading, for example power semiconductors, usually still have to be fixed on the printed circuit board by so-called through-hole mounting, since for purely surface-mounted components under high mechanical loading or high current loading there is the risk that soldered joints or the conductor tracks would be subjected to excessively high stress or even damaged.

In accordance with one embodiment, the method may furthermore include the following: in this regard, at least the first chip carrier part, the second chip carrier part, the first and second power semiconductor components and the capacitor are embedded into a plastic compound. In this case, the plastic compound introduced not only serves for mechanically protecting the first and second power semiconductor components, but also forms an electrical insulation in the interspaces between the first and second chip carrier parts, which are usually at different potentials of the supply voltage. Since the capacitor is now likewise embedded into the plastic compound, it can likewise be mechanically protected.

To summarize, it can be stated that various embodiments provide a power semiconductor device which includes a capacitor and can be realized in a space-saving manner.

In this regard, the power semiconductor device can be realized in a space-saving manner since the capacitor is mounted very near to the integrated circuits compared with customary power semiconductor devices and furthermore it is also possible to reduce the areal extent of a cooling body that is mounted on one side of the leadframe and serves for dissipating heat loss from the power semiconductor device.

Furthermore, by virtue of the fact that the capacitor is mounted very near to the integrated circuits, the efficacy and thus the efficiency of the capacitor can be increased.

In addition, such a power semiconductor device can be accommodated in a cost-effective TO housing.

FIG. 1 shows a schematic view of a power semiconductor device 1 in accordance with embodiments.

FIG. 1 shows the power semiconductor device 1 in this case in cross section. A first chip carrier part 2 and a second chip carrier part 3 are fitted in this power semiconductor device 1. The chip carrier parts 2, 3 are parts of a leadframe 4, which additionally also contains external leads 5. In this case, a first power semiconductor component 6 is applied on the first chip carrier part 2 and a second power semiconductor component 7 is applied to the second chip carrier part 3.

As is furthermore shown in FIG. 1, the power semiconductor device 1 furthermore includes a capacitor 8, wherein the capacitor 8 is mounted on two adjacent external leads.

FIG. 1 thus shows a power semiconductor device 1 which includes a capacitor 8 and can be realized in a space-saving manner since the capacitor 8 can be mounted very near to the integrated circuits.

In accordance with the embodiments in FIG. 1, the capacitor 8 is applied to the two adjacent external leads using SMD design technology in this case. FIG. 1 shows here a soldering connection 9 for the purpose of soldering, that is to say for the purpose of connecting the capacitor 8.

In accordance with the embodiments in FIG. 1, the power semiconductor components 6, 7 here are in each case electrically connected to the external leads 5 in a THT (through-hole technology) design. FIG. 1 here shows bonding wires 10 via which contact areas 11 on active top sides 12 of the first and second power semiconductor components 6, 7 are electrically connected to contact areas 13 on the external leads 5.

In this case, the power semiconductor components 6, 7 in FIG. 1 are IGBT components 14. Furthermore, however, the semiconductor components can also be further power semiconductor components, for example MOSFETs.

In this case, the two power semiconductor components 6, 7 can be embodied as part of a bridge circuit or else of a cascade circuit.

Figure 2:
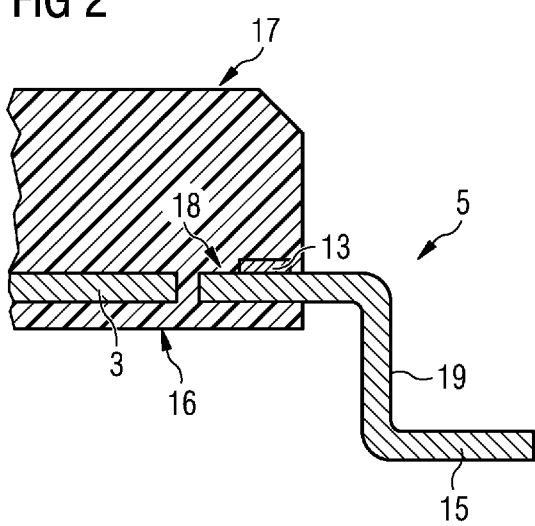
FIG. 2 shows a schematic view of an external lead of a power semiconductor device in accordance with embodiments.
Figure 3:
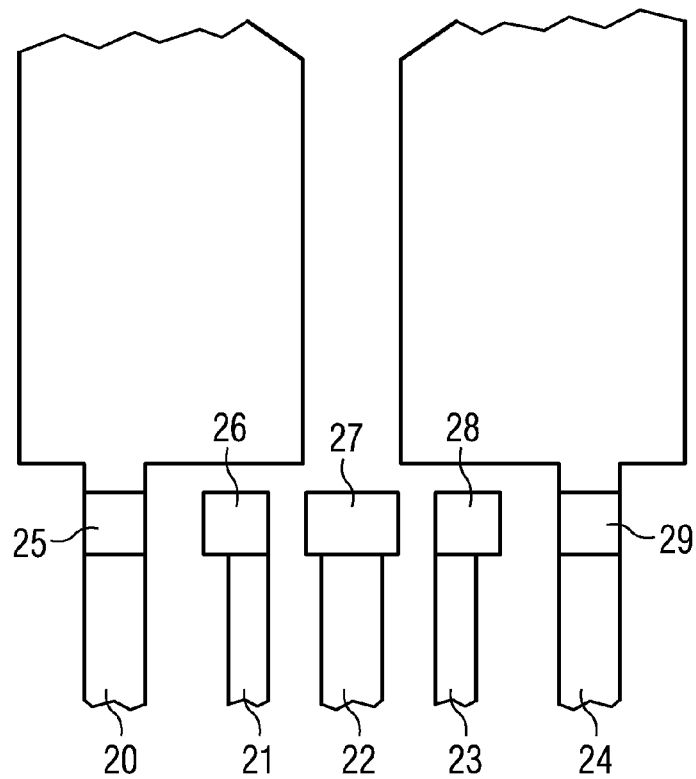
FIG. 3 shows a plan view of a power semiconductor device in accordance with embodiments.

FIG. 2 shows a schematic view of an external lead 5 of a power semiconductor device 1 in accordance with embodiments. Component parts and structural parts having the same design or function as in FIG. 1 bear the same reference signs and will not be discussed separately.

FIG. 2 here shows an external lead 5 having a signal lead 15 projecting from a housing 16 of the power semiconductor device 1, e.g. a TO housing 17.

In this case, the external lead 5 illustrated has a first part 18, on which the contact areas 13 are arranged and which lies in the same horizontal plane as the first chip carrier part 2 and the second chip carrier part 3, the signal lead 15, which is oriented parallel to the first part 18, and an angled portion 19 between the first part 18 and the signal lead 15, said angled portion being arranged orthogonally with respect to the first part 18 and the signal lead 15. As a result, it can furthermore be ensured that compared with customary external leads having a 40° angled portion, the capacitor can be mounted significantly nearer to the integrated circuits, as a result of which the requisite space requirement can be further optimized in the realization of the power semiconductor device.

Figure 3A:
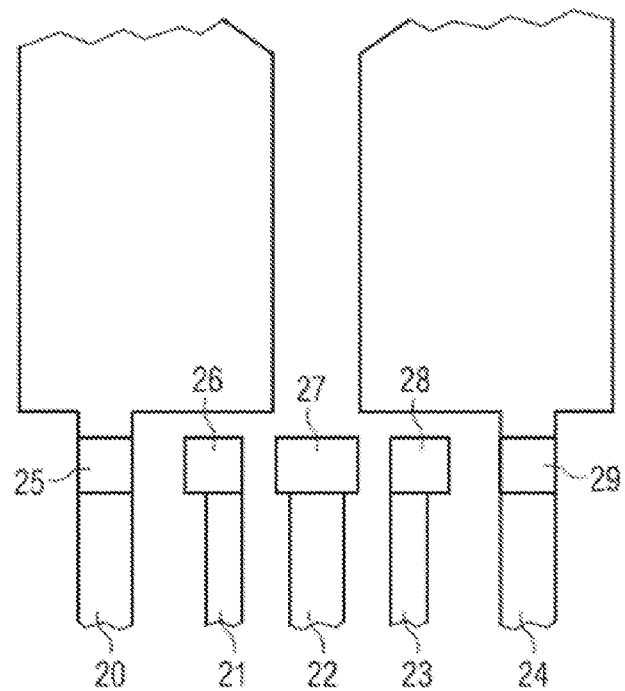
Figure 3B:
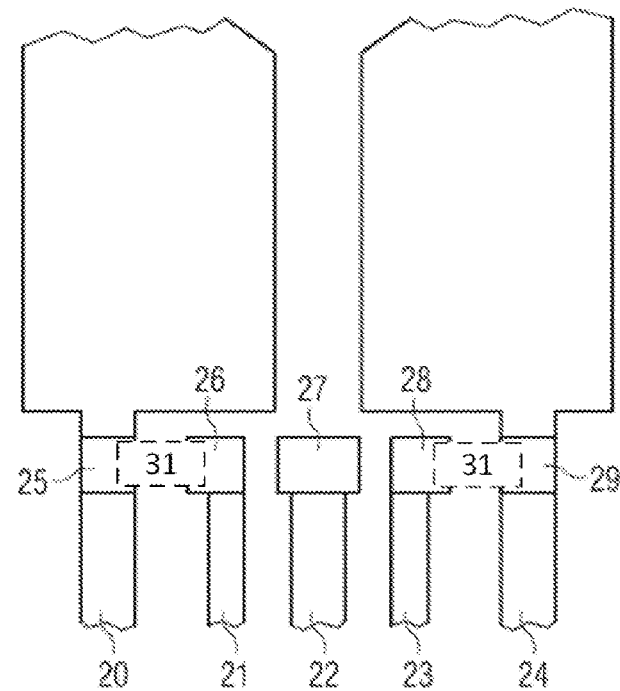
Figure 4:
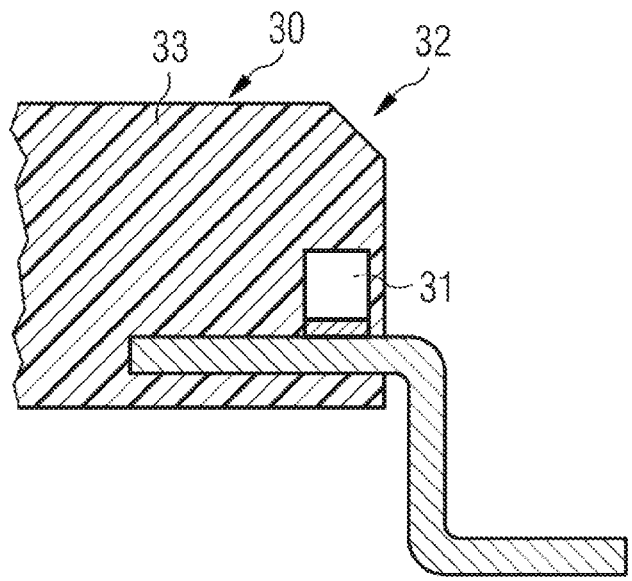

FIG. 3A and FIG. 3B respectively show a plan view of a power semiconductor device in accordance with embodiments. Component parts and structural parts having the same design or function as in FIG. 1 or 2 bear the same reference signs and will not be discussed separately.

In this case, FIG. 3A and FIG. 3B respectively show five external leads 20, 21, 22, 23, 24. In this case, the widths of the soldering connections 25, 26, 27, 28, 29 of the five external leads 20, 21, 22, 23, 24 have been adapted, e.g. widened, compared with customary external leads in such a way as to ensure secure and reliable mounting of the electrodes of a capacitor. In various embodiments, the external leads 20, 21, 22, 23, 24 in FIG. 3A and FIG. 3B, respectively, are designed here to ensure a secure mounting of a capacitor 31 between a first 20 and a second 21 and also a fourth 23 and a fifth 24 of the five external leads 20, 21, 22, 23, 24 (shown here in dashed lines to indicate optional placement). In this case, it is also possible for the design of one of the two adjacent external leads here to be mirror-inverted relative to the design of the other external lead of the two adjacent external leads, in order to ensure reliable and secure mounting of the capacitor.

Figure 4:
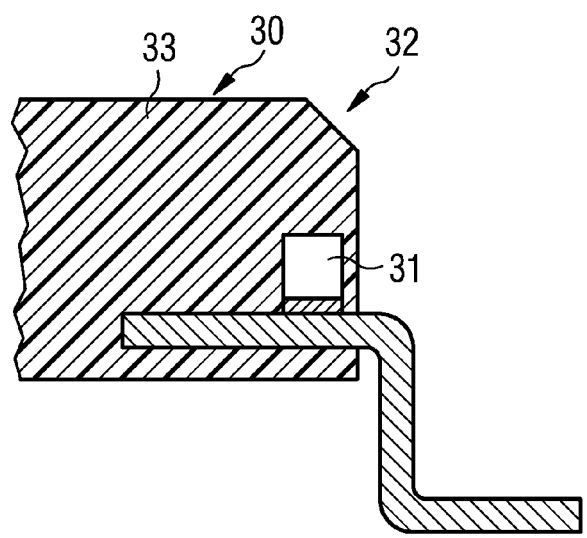
FIG. 4 shows a schematic view of a part of a further power semiconductor device in accordance with embodiments.

FIG. 4 shows a schematic view of part of a further power semiconductor device 30 in accordance with embodiments.

In this case, the power semiconductor device 30 in FIG. 4 differs from the power semiconductor device 1 in accordance with the embodiments in FIG. 1 to FIG. 3B in that, e.g. as a result of appropriate choice and dimensioning of the capacitor 31, the latter is likewise embedded into the housing 32 of the power semiconductor device 30, that is to say is embedded together with at least the first and second chip carrier parts and the first and second power semiconductor components into a plastic compound 33. Since the capacitor 31 is now likewise embedded into the plastic compound 33, it can now likewise be mechanically protected exactly like the further component parts of the power semiconductor device 30.

In this case, the plastic compound can furthermore be embodied in such a way that at least one upper surface of the first and second chip carrier parts is embedded into the plastic compound and a lower surface of the first and second chip carrier parts is left free of the plastic compound, such that the plastic compound has a lower outer surface which, together with the lower surfaces of the first and second chip carrier parts, forms a common outer surface of the power semiconductor device.

Figure 5:
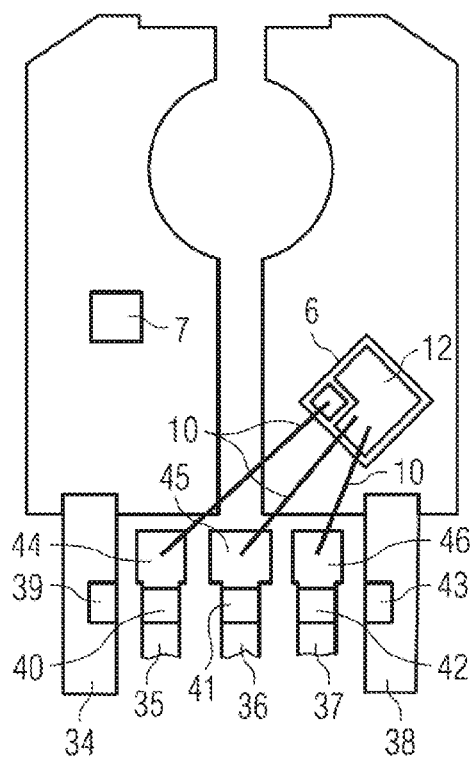
FIG. 5 shows a plan view of a power semiconductor device in accordance with embodiments.

FIG. 5 shows a plan view of a power semiconductor device in accordance with embodiments. Component parts and structural parts having the same design or function as in FIG. 1 or 2 bear the same reference signs and will not be discussed separately.

FIG. 5 here again shows five external leads 34, 35, 36, 37, 38, which have soldering connections 39, 40, 41, 42, 43 for connecting the capacitor and contact areas 44, 45, 46 for connecting bonding wires 10 for electrically connecting contact areas 11 on active top sides 12 of the first power semiconductor component 6 and of the second power semiconductor component 7 and also the contact areas 44, 45, 46. As can be discerned, the contact areas 44, 45, 46 differ here from the soldering connections, as a result of which the mounting of the bonding wires 10 and of the capacitor can be considerably simplified.

Although at least one embodiment has been demonstrated in the above description, various changes and modifications can be made. The embodiments mentioned are merely examples and are not intended to restrict the scope of validity, the applicability or the configuration in any way. Rather, the above description provides the person skilled in the art with a plan for implementing at least one embodiment, wherein numerous changes can be made in the function and the arrangement of elements described in one exemplary embodiment, without departing from the scope of protection of the appended claims and the legal equivalents thereof.

By way of example, it is conceivable to provide, instead of the first and second chip carrier parts and the first and second power semiconductor components, a single chip carrier part with a transistor mounted thereon, wherein, in accordance with the above description, a capacitor can be mounted between a source connection and a drain connection.

LIST OF REFERENCE SIGNS

1 Power semiconductor device
2 First chip carrier part
3 Second chip carrier part
4 Leadframe
5 External lead
6 First power semiconductor component
7 Second power semiconductor component
8 Capacitor
9 Soldering connection
10 Bonding wires
11 Contact areas
12 Active top side
13 Contact areas
14 IGBT component
15 Signal lead
16 Housing
17 TO housing
18 First part
19 Angled portion
20 First external lead
21 Second external lead
22 Third external lead
23 Fourth external lead
24 Fifth external lead
25 Soldering connection
26 Soldering connection
27 Soldering connection
28 Soldering connection
29 Soldering connection
30 Power semiconductor device
31 Capacitor
32 Housing
33 Plastic compound
34 External lead
35 External lead
36 External lead
37 External lead
38 External lead
39 Soldering connection
40 Soldering connection
41 Soldering connection
42 Soldering connection
43 Soldering connection
44 Contact area
45 Contact area
46 Contact area While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A power semiconductor device, comprising:
    a leadframe, which comprises a first chip carrier part and at least one second chip carrier part, which are fitted at a distance from one another and are in each case electrically conductive,
    at least one first power semiconductor component applied on the first chip carrier part,
    at least one second power semiconductor component applied on the second chip carrier part,
    external contacts in the form of external leads,
    a capacitor,
    wherein the capacitor is mounted on two adjacent external leads; and a housing composed of a plastic compound, which housing encloses at least the first chip carrier part and the second chip carrier part, the first and second power semiconductor components and the capacitor, wherein the plastic compound embeds at least upper surfaces of the first chip carrier part and of the second chip carrier part and leaves free at least one lower surface of the first chip carrier part and of the second chip carrier part, in such a way that the plastic compound has a lower outer surface which, together with the lower surfaces of the first chip carrier part and of the second chip carrier part, forms a common outer surface of the power semiconductor device.

2. The power semiconductor device of claim 1, wherein the two adjacent external leads comprise soldering connections for connecting the capacitor.

3. The power semiconductor device of claim 1, further comprising:
at least one bridge circuit having a high-side switch and a low-side switch,
wherein the low-side switch is integrated in the first power semiconductor component and the high-side switch is integrated in the second power semiconductor component.

4. The power semiconductor device of claim 1, further comprising:
a cascade circuit.

5. The power semiconductor device of claim 1, wherein the power semiconductor components include metal oxide semiconductor field effect transistors.

6. The power semiconductor device of claim 1, wherein the power semiconductor components include insulated gate bipolar transistors.

7. The power semiconductor device of claim 1, further comprising:
a transistor outline housing.

8. The power semiconductor device of claim 2, further comprising:
bonding wires configured to electrically connect contact areas on active top sides of the first power semiconductor component and of the second power semiconductor component and contact areas on the external leads.

9. The power semiconductor device of claim 8, wherein the soldering connections differ from the contact areas on the external leads.

10. The power semiconductor device of claim 9, wherein the external leads in each case comprise a first part, on which the contact areas are arranged and which lies in the same horizontal plane as the first chip carrier part and the second chip carrier part, a signal lead, which is oriented parallel to the first part and an angled portion arranged between the first part and the signal lead, orthogonally with respect to the first part and the signal lead.

11. A method for producing a power semiconductor device,
the method comprising:
providing a first electrically conductive chip carrier part, a second electrically conductive chip carrier part and external contacts in the form of external leads;
applying at least one first power semiconductor component to the first chip carrier part and at least one second power semiconductor component to the second chip carrier part;
electrically connecting contact areas on active top sides of the first and second power semiconductor components to contact connections on the external leads;
mounting a capacitor onto two adjacent external leads; and
embedding the first and second chip carrier parts, the first and second power semiconductor components and the capacitor into a plastic compound, wherein the plastic compound embeds at least upper surfaces of the first chip carrier part and of the second chip carrier part and leaves free at least one lower surface of the first chip carrier part and of the second chip carrier part, in such a way that the plastic compound has a lower outer surface which, together with the lower surfaces of the first chip carrier part and of the second chip carrier part, forms a common outer surface of the power semiconductor device.

12. The method of claim 11, wherein the capacitor is soldered onto the two adjacent external leads.

13. The method of claim 11, wherein the contact areas on the active top sides of the first and second power semiconductor components are electrically connected to contact areas on the external leads via bonding wires.

14. A power semiconductor device, comprising:
a leadframe, which comprises a first chip carrier part and at least one second chip carrier part, which are fitted at a distance from one another and are in each case electrically conductive,
at least one first power semiconductor component applied on the first chip carrier part,
at least one second power semiconductor component applied on the second chip carrier part,
external contacts in the form of external leads,
a capacitor,
wherein the external leads in each case comprise a first part, on which contact areas are arranged and which lies in the same horizontal plane as the first chip carrier part and the second chip carrier part, a signal lead, which is oriented parallel to the first part and an angled portion arranged between the first part and the signal lead, orthogonally with respect to the first part and the signal lead,
wherein the capacitor is mounted on the first part of the two adjacent external leads.

15. The power semiconductor device of claim 1, wherein the external leads in each case comprise a first part, on which contact areas are arranged and which lies in the same horizontal plane as the first chip carrier part and the second chip carrier part, a signal lead, which is oriented parallel to the first part and an angled portion arranged between the first part and the signal lead, orthogonally with respect to the first part and the signal lead.

16. The power semiconductor of claim 1, wherein the two adjacent external leads comprise a contact area configured for electrical connection to bonding wires, a soldering connection configured for electrical connection to the capacitor, and an external contact configured for external electrical connection.

17. The power semiconductor of claim 1, wherein the capacitor has a capacitance in the range of 1 nF to 10 µF.

18. The power semiconductor of claim 1,
wherein the lower outer surfaces of the first chip carrier and the second chip carrier are exposed and configured as a ground contact of the power semiconductor.

19. The power semiconductor of claim 1,
wherein the lower outer surfaces of the first chip carrier and the second chip carrier are exposed and configured as a heat dissipation path.

20. The power semiconductor of claim 15,
wherein the capacitor is mounted on the first part of the two adjacent external leads.

* * * * *